(12) United States Patent  
Fertner et al.

(10) Patent No.: US 9,923,600 B2  
(45) Date of Patent: Mar. 20, 2018

(54) ESTIMATION OF IMPEDANCES IN A TRANSMISSION MEDIUM

(71) Applicant: Telefonaktiebolaget LM Ericsson (publ), Stockholm (SE)

(72) Inventors: Antoni Fertner, Stockholm (SE); Per Ola Börjesson, Lund (SE); Klas Ericson, Göteborg (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/317,544

(22) PCT Filed: Jun. 19, 2014

(86) PCT No.: PCT/SE2014/050766  
§ 371 (c)(1),  
(2) Date: Dec. 9, 2016

(87) PCT Pub. No.: WO2015/195019  
PCT Pub. Date: Dec. 23, 2015

(65) Prior Publication Data  
US 2017/0117936 A1    Apr. 27, 2017

(51) Int. Cl.  
*G01R 27/00* (2006.01)  
*H04B 3/46* (2015.01)  
(Continued)

(52) U.S. Cl.  
CPC ............... *H04B 3/46* (2013.01); *G01R 27/06* (2013.01); *G01R 31/11* (2013.01)

(58) Field of Classification Search  
CPC ........ G01R 23/16; G01R 23/20; G01R 27/00; G01R 27/06; G01R 27/28; G01R 31/11;  
(Continued)

(56) References Cited

U.S. PATENT DOCUMENTS

| 7,235,982 B1* | 6/2007 | Shoulders | G01R 27/28 |
| | | | 324/601 |
| 2004/0193382 A1* | 9/2004 | Adamian | G01R 27/28 |
| | | | 702/118 |

(Continued)

FOREIGN PATENT DOCUMENTS

| EP | 1411361 A1 | 4/2004 |
| WO | 2007089173 A1 | 8/2007 |

OTHER PUBLICATIONS

International Search Report and Written Opinion for International Patent Application No. PCT/SE2014/050766, dated Mar. 12, 2015, 8 pages.

*Primary Examiner* — Shawkat M Ali  
(74) *Attorney, Agent, or Firm* — Withrow & Terranova, PLLC

(57) ABSTRACT

The present disclosure relates to wireline communication systems, and in particular to aspects of a method and a line estimation device for estimating a characteristic impedance of a section of a transmission medium. The method comprises determining, by a test equipment having a test port with known impedance $Z_{ref}$, an $S_{11}$ scattering parameter vector $S_{11ref}[f]$ of the transmission medium, indexed by frequency f. The method also comprises generating, based on $Z_{ref}$ and $S_{11ref}[f]$, a model of reflection in the transmission medium corresponding to an observation of the transmission medium via a test port having a test impedance $Z_T$, and also estimating the characteristic impedance of the section as a value of $Z_T$ which minimizes a difference between a reflection value of the model of reflection and a respective target reflection value of the section.

18 Claims, 5 Drawing Sheets

(51) Int. Cl.
*G01R 27/06* (2006.01)
*G01R 31/11* (2006.01)

(58) Field of Classification Search
CPC ......... G01R 31/28; G01R 35/00; G06F 17/10; G06F 17/50; G06F 19/00; H04B 3/46
USPC .......... 324/601, 612, 624, 763.01; 375/224; 702/59, 65, 85, 107, 117; 703/2, 13
See application file for complete search history.

(56) References Cited

U.S. PATENT DOCUMENTS

| | | | | |
|---|---|---|---|---|
| 2005/0203711 | A1* | 9/2005 | Taylor | G01R 27/04 702/59 |
| 2006/0155498 | A1* | 7/2006 | Dunsmore | G01R 27/28 702/107 |
| 2008/0048677 | A1* | 2/2008 | Tan | G01R 35/005 324/638 |
| 2008/0195344 | A1* | 8/2008 | Heuermann | G01R 27/28 702/107 |
| 2009/0024340 | A1* | 1/2009 | Borjesson | H04M 3/306 702/65 |
| 2010/0176789 | A1* | 7/2010 | Zoughi | G01R 27/28 324/76.13 |
| 2012/0215503 | A1* | 8/2012 | Fertner | H04M 3/26 703/2 |
| 2013/0138402 | A1* | 5/2013 | Fang | G06F 17/5036 703/2 |
| 2013/0265079 | A1* | 10/2013 | Pupalaikis | G01R 31/2818 324/763.01 |

* cited by examiner

ESTIMATION OF IMPEDANCES IN A TRANSMISSION MEDIUM

This application is a 35 U.S.C. § 371 national phase filing of International Application No. PCT/SE2014/050766, filed Jun. 19, 2014, the disclosure of which is incorporated herein by reference in its entirety.

TECHNICAL FIELD

The present disclosure relates to wireline communication systems and in particular to aspects of a method and a line estimation device for estimating a characteristic impedance of a transmission medium.

BACKGROUND

Line estimation, i.e., the determining of one or more characterizing properties of a transmission medium, is important in order to locate and identify problems in the transmission medium, including sheath faults, broken conductors, water damage, loose connectors, crimps, cuts, smashed cables, shorted conductors, and a variety of other faults. Herein, the term transmission media comprises all types of twisted pair and coaxial cables, both aerial and underground, as well as other types of wire-like transmission media used for conveying communication signals.

One key type of characterizing property determined through line estimation comprises characteristic impedances of different sections of the transmission medium.

Time domain reflectometry, TDR, is a method conventionally applied to determine transmission medium properties. In TDR, rectangular pulses, step impulses, pseudorandom sequences or signals generated in frequency domain are transmitted on a transmission medium, whereupon reflected signals are analyzed in order to locate and identify problems in the transmission medium. However, TDR as applied today is associated with some limitations. For instance, determining cable loops, i.e., locating and characterizing loop components of the transmission media, such as their length and respective electrical parameters, is a challenging task, mainly due to computational burden and difficulty in obtaining sufficient accuracy in the end result.

The ever increasing demand for data transmission rate and capacity drives communication systems towards increased communication bandwidth. In order to ensure reliable operation according to current and future technical standards and regulations, monitoring and diagnostics of deployed networks becomes increasingly important. However, in current line estimation methods, increasing center frequency and frequency bandwidth imply an increase in data processing requirements, leading to increases in processing time, hardware requirements, and energy consumption.

Thus, there is a need for new line estimation methods that are reliable, fast, support high bandwidth transmission media, and which are inexpensive in terms of computational load and data processing requirements.

SUMMARY

An object of the present disclosure is to provide at least a method and a line estimation device which seek to mitigate, alleviate, or eliminate one or more of the above-identified deficiencies in the art and disadvantages singly or in any combination and to provide improved line estimation.

This object is obtained by a method in a line estimation device for estimating a characteristic impedance of a transmission medium in a communication system. The method comprises determining, by a test equipment having a test port with known impedance $Z_{ref}$, an $S_{11}$ scattering parameter vector $S_{11ref}[f]$ of the transmission medium, indexed by frequency f, the vector $S_{11ref}[f]$ describing signal reflection in the transmission medium. The method also comprises generating, based on $Z_{ref}$ and $S_{11ref}[f]$, a model of reflection in the transmission medium describing signal reflection values in the transmission medium assuming observations of the transmission medium via a test port having a variable test impedance $Z_T$. The method further comprises estimating a characteristic impedance of a section of the transmission medium as a value of $Z_T$ which minimizes a difference between a signal reflection value of the model of reflection and a respective target reflection value of the section.

The disclosed method exploits observation of individual reflections in the transmission medium, which reflections are due to transitions between sections of the transmission medium. This leads to increased line estimation accuracy by a method which is of low complexity and also fast in terms of computation time.

Thus, a method for estimating a characteristic impedance of a section of a transmission medium in a communication system is provided which is reliable, fast, and which supports high bandwidth transmission media. Furthermore, the present method is inexpensive and does not involve excessive computation or data processing.

According to some aspects, the respective target reflection value of the section comprises a constant value set to zero. This feature allows for a further reduction in complexity of the method.

According to other aspects, the respective target reflection value of the section comprises a straight line fitting to a time domain representation of $S11_{ref}[f]$, evaluated at the time delay T corresponding to a distance from the test equipment to the start of the section. This feature allows for a further increase in accuracy of the method in estimating characteristic impedance.

According to some further aspects, the model of reflection comprises an $S_{11}$ scattering parameter vector $S_{11T}[f]$ having a time domain representation $S_{11T}(T)$ determined by a single point of the inverse fast Fourier transform, IFFT, evaluated in time delay T corresponding to a distance from the test equipment to the start of the section.

Thus, only a single point of the IFFT, i.e., one value of the IFFT vector of values, is necessary to compute, leading to a further reduction in computational burden.

According to aspects, the estimating further comprises estimating a characteristic impedance of one or more further sections of the transmission medium based on $Z_{ref}$ and $S_{11ref}[f]$.

Thus, a sequence of one or more sections of a transmission medium is characterized by the proposed method, leading to a line estimation of transmission medium properties comprising the characteristics of one or more individual sections of the transmission medium.

The object is also obtained by a line estimation device arranged to estimate a characteristic impedance of a transmission medium in a communication system. The line estimation device comprises a test equipment, having a test port with known impedance $Z_{ref}$, arranged to determine an $S_{11}$ scattering parameter vector $S_{11ref}[f]$ of the transmission medium, indexed by frequency f. The vector $S_{11ref}[f]$ describes signal reflection in the transmission medium. The line estimation device also comprises a model of reflection in the transmission medium describing signal reflection values in the transmission medium assuming observations of the transmission medium via a test port having a variable test impedance $Z_T$, as well as a processing unit arranged to estimate the characteristic impedance of the section, based on $Z_{ref}$ and $S_{11ref}[f]$, as a value of $Z_T$ which minimizes a difference between a reflection value of the model and a respective target reflection value of the section.

There is further provided a computer program comprising computer program code which, when executed in a line estimation device, causes the line estimation device to execute a method according to aspects disclosed herein.

The computer program and the line estimation device display advantages corresponding to the advantages already described in relation to the methods.

BRIEF DESCRIPTION OF THE DRAWINGS

Further objects, features, and advantages of the present disclosure will appear from the following detailed description, wherein some aspects of the disclosure will be described in more detail with reference to the accompanying drawings, in which.

DETAILED DESCRIPTION

Figure 1:
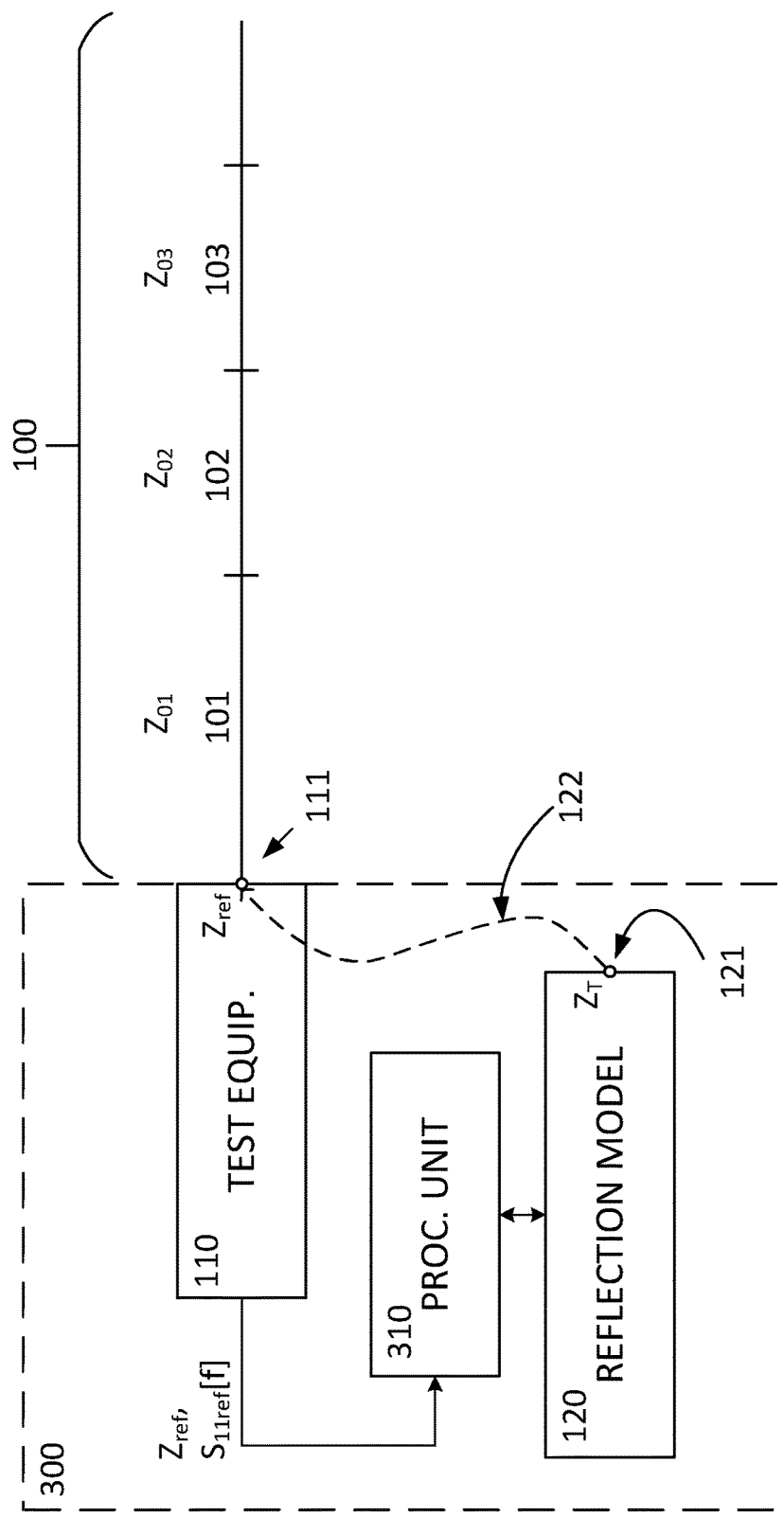
FIG. 1 is a schematic overview of a transmission medium with a line estimation device.

Aspects of the present disclosure will be described more fully hereinafter with reference to the accompanying drawings. The apparatus, computer program and methods disclosed herein can, however, be realized in many different forms and should not be construed as being limited to the aspects set forth herein. Like numbers in the drawings refer to like elements throughout.

The terminology used herein is for the purpose of describing particular aspects of the disclosure only, and is not intended to limit the invention. As used herein, the singular forms "a", "an" and "the" are intended to include the plural forms as well, unless the context clearly indicates otherwise.

Up until recently, transmission line rates and corresponding transmission bandwidths have been such as to not allow a time resolution fine enough to discern individual reflections in the transmission medium. However, with increasing data rates, the time resolution possible to obtain from observation of, e.g., an S11 scattering parameter vector, increases.

As an example, modern short length Ethernet cables for indoors applications and high data rates today support transmission bandwidths up to and beyond 400 MHz. This large bandwidth implies a corresponding time domain reflectometry, TDR, resolution on the order of nanoseconds. Thus, tiny reflections due to diminutive changes of the impedance along a wire can now be observed by test equipment connected to the transmission line. Since the wavelength at 400 MHz is about half meter, as a rule of thumb, reflecting objects of the size 2.5 to 3 meters is distinguishable. This type of high resolution observation was impossible or at least very difficult with prior transmission media supporting only lower transmission rates due to, e.g., proportionally longer wavelengths and low-pass filtering along the transmission line.

The electrical properties of a transmission medium, such as a cable or wire, is described at least partly by so-called S-parameters, or scattering parameters. The term 'scattering' refers to the effect observed when an electromagnetic wave is incident on an obstacle or impairment, or passes across fluctuating electric media. In the context of S-parameters, scattering refers to the way in which the currents and voltages traveling through the transmission medium are affected when meeting differences in impedance along the transmission medium.

The influence of the reflection coefficient at the ends of the transmission medium has a negative impact on the possibility to characterize the transmission medium. In the case of large mismatches, the reflected signal due to this mismatch may overshadow the electrical behavior of other parts of the transmission medium. Therefore, a correct characterization of the transmission medium requires subsequent elimination of reflected waves.

It is proposed herein a method of determining the characteristic impedances of a transmission medium based on measurement of the S-parameter vector $S_{11}$, i.e., signal reflection in sections of the transmission medium.

Turning now to FIG. 1, which shows a schematic overview of a transmission medium 100 connected to a line estimation device 300. The transmission medium 100 here comprises a plurality of sections 101, 102, 103 having respective characteristic impedances $Z_{01}$, $Z_{02}$, $Z_{03}$. The sections shown in FIG. 1 will henceforth be referred to as the first 101, the second 102, and the third 103 section of the transmission medium 100.

The line estimation device 300 comprises test equipment 110, a model of reflection 120, and a processing unit 310. The test equipment 110 further has a test port 111 with reference impedance $Z_{ref}$.

The test equipment 110 is arranged to determine an S11 scattering parameter vector $S_{11ref}[f]$ of the transmission medium 100. Given that the impedance of the test port 111 has reference impedance $Z_{ref}$, the measured frequency domain S-parameter $S_{11ref}[f]$ is described by $$S_{11ref}[f] = \frac{Z_{in}[f] - Z_{ref}}{Z_{in}[f] + Z_{ref}} \quad (1)$$

where $Z_{in}[f]$ is a function of frequency and $Z_{ref}$ is here assumed constant over frequency. From equation (1) above, the true input impedance of the transmission medium is derived as $$Z_{in}[f] = Z_{ref} \cdot \frac{1 + S_{11ref}[f]}{1 - S_{11ref}[f]} \quad (2)$$

Note that, in time domain, $Z_{in}[f]$ is equal to the characteristic impedance of the transmission medium because no information about, e.g., termination, etc., has had time to arrive at time instant zero.

Hence, the true input impedance of the transmission medium can be estimated based on the reference impedance $Z_{ref}$ and on the frequency domain S-parameter $S_{11ref}[f]$.

Figure 2:
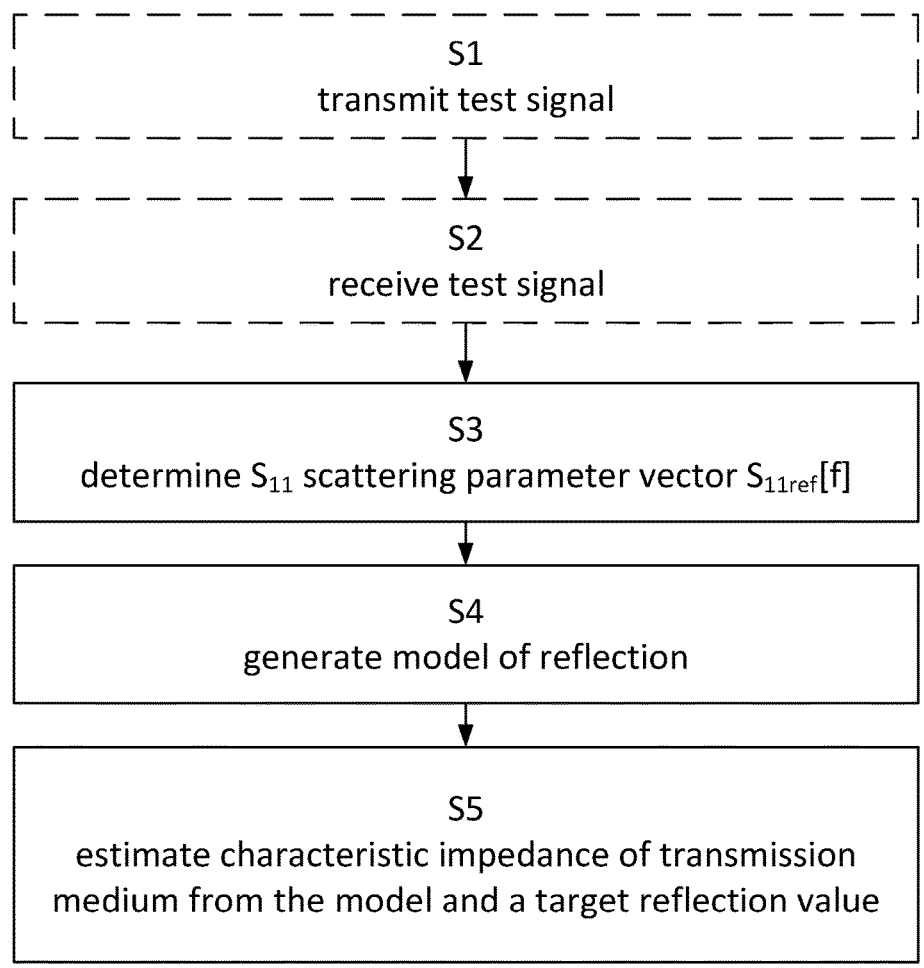
FIG. 2 is a flowchart illustrating embodiments of method steps performed in a line estimation device.

The present technique is illustrated in FIG. 2 which shows a flowchart illustrating embodiments of method steps performed in a line estimation device, such as the line estimation device 300 in FIG. 1. In particular, there is illustrated a method in a line estimation device for estimating a characteristic impedance $Z_{01}$, $Z_{02}$, $Z_{03}$ of a transmission medium 100 in a communication system.

The method is applicable for estimating one or more respective impedances of different sections 101, 102, 103, of the transmission medium, as will be explained below.

The method comprises determining S3, by a test equipment 110 having a test port 111 with known impedance $Z_{ref}$, an $S_{11}$ scattering parameter vector $S_{11ref}[f]$ of the transmission medium 100, indexed by frequency f, the vector $S_{11ref}[f]$ describing signal reflection in the transmission medium 100.

The test equipment 110 is, according to aspects, connected to an end of the transmission medium 100 via the test port 111 as shown in FIG. 1.

The method also comprises generating S4, based on $Z_{ref}$ and $S_{11ref}[f]$, a model of reflection in the transmission medium 100 describing signal reflection values in the transmission medium 100 assuming observations of the transmission medium 100 via a test port 121 having a variable test impedance $Z_T$.

As will be further detailed below, said model of reflection provides information related to hypothetical observations of $S_{11}$ scattering parameter vectors of the transmission medium 100 determined with an assumed test port 121 having impedance different from $Z_{ref}$, i.e., $Z_T$. Thus, by varying the hypothetical test impedance $Z_T$, the model of reflection disclosed herein provides information about what type of reflections would be generated in the transmission medium 100 and observed at a test port 121, should the test port 121 have had an impedance of $Z_T$.

The method further comprises estimating S5 a characteristic impedance $Z_{01}$, $Z_{02}$, $Z_{03}$ of a section 101, 102, 103 of the transmission medium 100 as a value of $Z_T$ which minimizes a difference between a signal reflection value of the model of reflection and a respective target reflection value of the section.

Thus, as an example, to estimate a characteristic impedance $Z_{01}$ of a first section 101 of the transmission medium, one sets different values of $Z_T$ in the model of reflection and observes, for each set value of $Z_T$, the reflection behavior of the transmission medium 100. When $Z_T$ is set at a value for which the model of reflection predicts a small or nonexistent reflection at the boundary between the test port 121 and the first section 101 of the transmission medium, then $Z_T$ must be similar or substantially equal to the characteristic impedance $Z_{01}$ of the first section of the transmission medium 100.

According to some aspects, the determining S3 further comprises transmitting S1, by the test equipment 110, a test signal on the transmission medium via the test port 111 with known impedance $Z_{ref}$, and receiving S2 a reflected signal of the test signal. Thus, the $S_{11}$ scattering parameter vector $S_{11ref}[f]$ is determined based on the reflected signal.

Thus, turning again to FIG. 1, the S-parameter $S_{11ref}[f]$ may be recalculated for arbitrary reference impedances, for instance said test impedance $Z_T$. Hence, its resultant value $S_{11,1}$ may be expressed in terms of frequency f and $Z_T$;

$$S_{11,1}[f, Z_T] = \frac{\frac{1+S_{11ref}[f]}{1-S_{11ref}[f]}Z_{ref} - Z_T}{\frac{1+S_{11ref}[f]}{1-S_{11ref}[f]}Z_{ref} + Z_T} \quad (3)$$

This vector $S_{11,1}[f, Z_T]$ corresponds to an S11 measurement made by a hypothetical test equipment connected to the first section 101 of the transmission medium 100 via a test port 121 having assumed impedance $Z_T$.

It is noted that the expression $$Z_{ref} \cdot \frac{1+S_{11ref}}{1-S_{11ref}}$$

in equation (3) above is a constant and therefore not in need of re-calculation during line estimation.

Now, if the system's reference impedance is equal to the characteristic impedance $Z_{01}$ of the first section 101 of the transmission medium, then the TDR signal should be substantially equal to zero at the time instance T=0. One can therefore estimate the characteristic impedance of one or more sections of the transmission medium by varying $Z_T$ to minimize a hypothetical reflection in the transmission medium.

Thus, according to aspects, the estimating S5 comprises estimating a characteristic impedance $Z_{01}$ of a first section 101 of the transmission medium directly connected to the test equipment 110, the model of reflection comprising a first $S_{11}$ scattering parameter vector $S_{11,1}[f]$ given by equation (3) above.

Furthermore, according to some aspects, the respective target reflection value of the section referred to above comprises a constant value set to zero.

There are a variety of numerical methods available to determine zero crossings of a function. Examples include the bisection method, the secant method, and Regula Falsi. All these algorithms and methods can be applied here.

Instead of finding a zero crossing, it is of course also possible to minimize an absolute value of the function.

In order to further improve on the accuracy of the method, the target reflection value can be set according to a straight line fitting 210, 211 to a time domain representation of $S_{11ref}[f]$, evaluated at the time delay T corresponding to a distance from the test equipment 110 to the start of the section. Herein, a straight line fitting is a linear approximation to a function, obtained, e.g., by means of a least squares operation or similar.

Thus, according to some other aspects, the respective target reflection value of the section referred to above comprises a straight line fitting 210, 211 to a time domain representation of $S11_{ref}[f]$, evaluated at the time delay T corresponding to a distance from the test equipment 110 to the start of the section.

However, at the distance zero the transmission medium characteristic impedance is subject to the same fluctuations as in any point along the transmission medium, and the changes in characteristic impedance are very small. Therefore the accuracy impairment associated with using a target reflection value of zero will be small in many scenarios.

Figure 3:
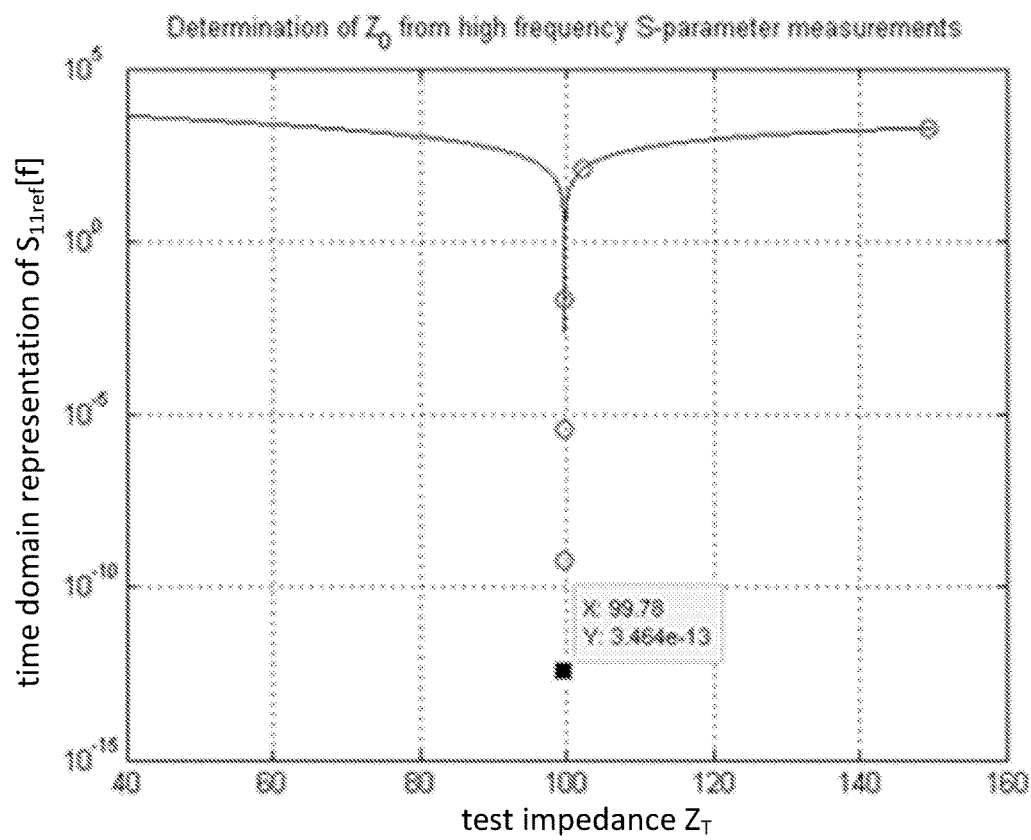
FIG. 3 is a graph showing reflection magnitude as function of a test impedance.

FIG. 3 is a graph showing reflection magnitude as function of test impedance.

Due to the always present signal dispersion in the transmission medium, the actual reflection value at time instant zero is rarely exactly equal to zero, as shown in FIG. 3.

The inverse Fourier transforms of the respective S-parameters, $S_{11,1}[f, Z_T]$, i.e., corresponding to the different values of $Z_T$, results in different hypothetical TDR signals, i.e., different patterns in time domain, since $$\text{TDR\_signal}(t_k, Z_T) = \frac{1}{N}\sum_{n=0}^{N-1} S_{11,1}(f_n, Z_T) \cdot e^{j \cdot 2\pi nk/N} \quad (4)$$

where $f_n$ are discrete frequencies an N is total number of frequencies.

As shown in FIG. 3, in case the TDR signal at time instant zero is not equal to zero, then the characteristic impedance $Z_{01}$ differs from the value of the test impedance $Z_T$, while, when the amplitude of the reflected signal at the time instant T=0, is close to zero, the value of $Z_T$ closely matches the characteristic impedance $Z_{01}$ of the first section 101 of the transmission medium 100. Hence, minimizing the first reflection due to mismatch at the input, i.e., on the junction between transmitter and transmission medium is equivalent to establishing characteristic impedance $Z_{01}$ of the transmission medium 100.

An FFT or IFFT comprises a vector of time or frequency domain values. These values are herein referred to as points of the FFT or IFFT. Thus, an FFT vector comprises a number of points of the FFT in frequency domain, each point corresponding to a given frequency component of the FFT. Similarly, an IFFT vector comprises a number of points of the IFFT vector in time domain, each point corresponding to a given time instant of a time domain waveform. When transforming a frequency-domain representation of a signal into a time-domain representation, or vice-versa, all points in the FFT or IFFT vector need not always be determined.

In the context of the present teaching, it is noted that only one point needs to be computed in the time domain IFFT vector, and not the whole IFFT vector. This leads to a substantial reduction in complexity of the proposed methods for line estimation.

Thus, according to aspects, the model of reflection comprises an $S_{11}$ scattering parameter vector $S_{11T}[f]$ having a time domain representation $S_{11T}(T)$ determined by a single point of the inverse fast Fourier transform, IFFT, evaluated in time delay T corresponding to a distance from the test equipment 110 to the start of the section.

The single point of the IFFT, according to some aspects, corresponds to a coefficient $a_0$, of the Fourier transform, $$a_0 = \frac{1}{N}\sum_{n=0}^{N-1} S_{11,1}(f_n, Z_T) \qquad (5)$$

Hence, according to aspects, the section referred to above is a first section 101 of the transmission medium directly connected to the test equipment 110, T=0, and said time domain representation is given by $$S_{11T}(T) = \frac{1}{N}\sum_{n=0}^{N-1} S_{11T}[f] \qquad (6)$$

where N equals the length of vector S11T[f], and the constant factor 1/N is preferably omitted during, e.g., minimization of the expression in (6).

The imaginary part of $S_{11,1}(f_n, Z_T)$ can be omitted due to Hermitian symmetry. In this case, the estimated characteristic impedance $Z_{01}$ is the value of $Z_T$ which yields a factor $\widetilde{a_0}$ as close to zero as possible, where $$\widetilde{a_0} = \frac{1}{N}\sum_{n=0}^{N-1} \text{real}(S_{11,1}(f_n, Z_T)) \qquad (7)$$

Therefore, according to aspects, the section is a first section 101 of the transmission medium directly connected to the test equipment 110, T=0, and said time domain representation is given by $$S_{11T}(T) = \text{real}\left\{\frac{1}{N}\sum_{n=0}^{N-1} S_{11T}[f]\right\} \qquad (8)$$

where N equals the length of vector S11T[f], and the constant factor 1/N is again preferably omitted during, e.g., minimization of the expression in (8).

With reference to equations (1) and (3) above, it is noted that setting $Z_T=0$ results in $S_{11,1}(f_n, Z_T)=1$ at all frequencies whereas setting $Z_T=\infty$ results in $S_{11,1}(f_n, Z_T)=-1$ for all frequencies. Thus, equation (5) becomes one or minus one for $Z_T=0$ or $Z_T=1$, respectively. Consequently, somewhere between $Z_T=0$ and $Z_T=\infty$ the functions given in equations (5)-(8) must attain a zero value.

Figure 4:
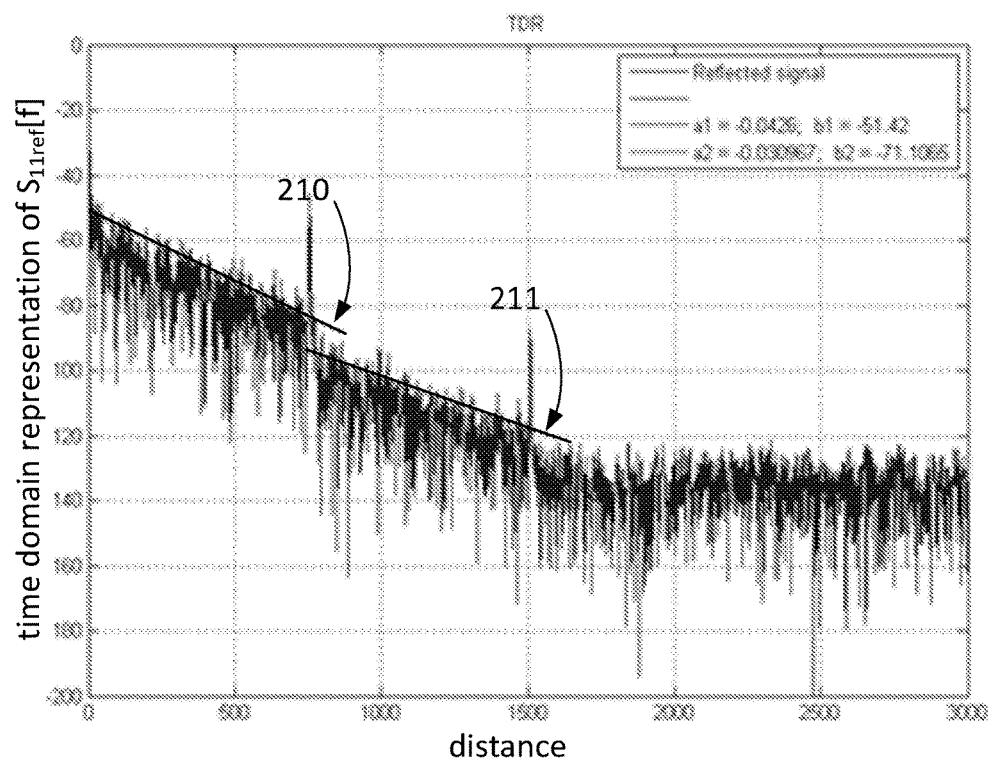
FIGS. 4-5 are graphs illustrating reflection in a transmission medium.
Figure 5:
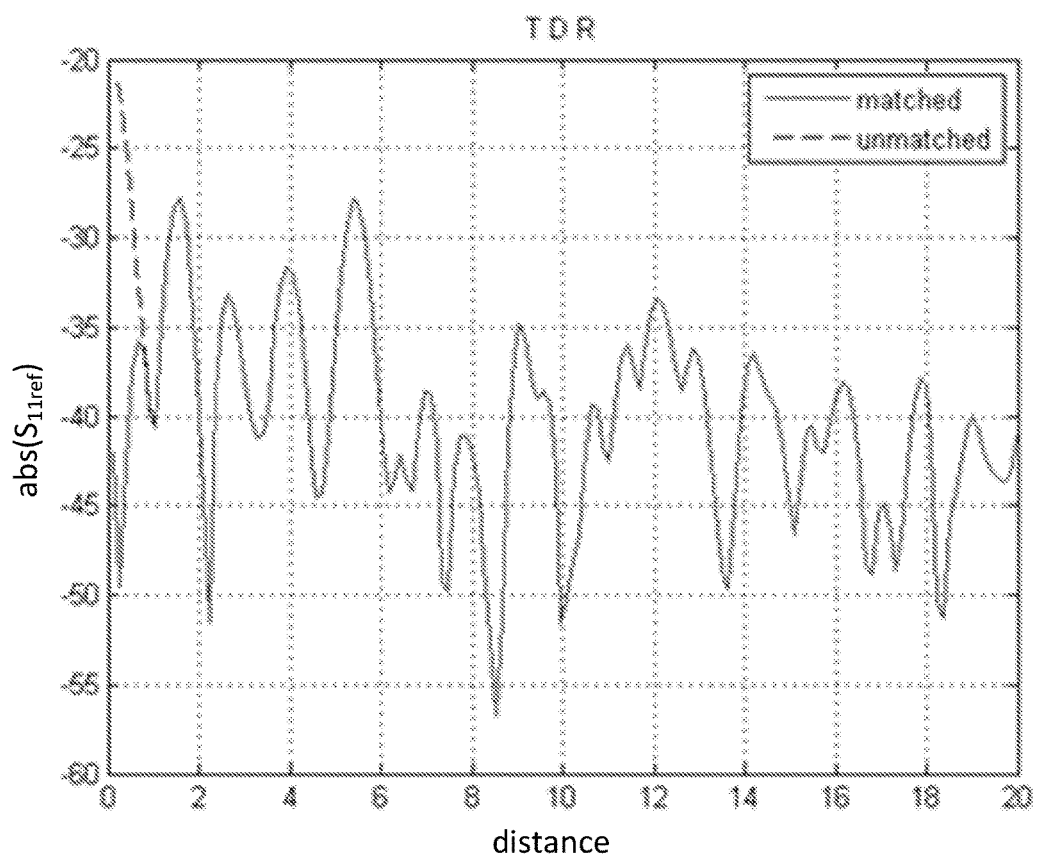

FIGS. 4 and 5 show graphs illustrating reflection in a transmission medium.

Let us consider a situation where two transmission lines of different "quality" are connected in series. After straight line fitting according to $$\text{Magnitude}=a*\text{Distance}+b=a*t*v_{op}+b \qquad (9)$$

where Magnitude is reflection magnitude, Distance corresponds to a distance from the test equipment 110 along the transmission medium 100, and $v_{op}$ is the velocity of propagation of the electromagnetic wave, while constants a and b, known as slope and intercept, have a physical interpretation as attenuation and average reflection coefficient.

As noted above, straight line fittings for each successive section can be computed using basic mathematical methods, e.g., least-squares fitting. It is recognized that the second section in FIG. 4 is made of "higher quality" then the first. This is because the slope and intercept of the line fitting 211 of the second section is smaller than that of the first section line fitting 210.

Respectively, a1<a2 means that the second section attenuates a propagating signal more per kilometer transmission medium than the first section does, viz.

$$e^{a1*1\ km} > e^{a2*1\ km} \qquad (10)$$

Furthermore, b1>b2 means that the average reflection coefficient evaluated along the line is smaller for the second section than for the first section, viz.

$$10^{\frac{b1}{20}} > 10^{\frac{b2}{20}} \qquad (11)$$

Thus, using, e.g., equation (5) but instead of finding a zero value at time T=0 and/or in its vicinity, applying the value at the intercept point $$\text{e.g. } 10^{\frac{b1}{20}} \approx 2.7 * 10^{-3},$$

results in the "true" mean value of characteristic impedance of the inspected transmission medium, and thus some improvement in the line estimation accuracy.

Further, one can exploit the time domain signal in the vicinity of zero to determine yet another estimate of transmission medium characteristic impedance $Z_{01}$.

Equation (4) can be expressed as $$\text{TDR\_signal}(t_k, Z_T) = 10^{\frac{a*t+b}{20}} \quad (12)$$

The first derivate at the time instance zero equals $$\frac{d}{dt}\text{TDR\_signal}(t_k, Z_T) = \frac{a}{20} \cdot 10^{\frac{b}{20}} \cdot \ln(10) \quad (13)$$

and performing derivation on equation (4) above leads to $$\frac{d}{dt}\text{TDR\_signal}(t_k, Z_T) = 2\pi i \sum_{n=0}^{N-1} f_n \cdot S_{11}(f_n, Z_T) \quad (14)$$

Per analogiam to equations (4) through (8), one may conclude that an estimate of characteristic impedance $Z_{01}$ is obtained when the value of the factor $\tilde{a_0'}$, $$\tilde{a_0'} = 2\pi \sum_{n=0}^{N-1} f_n \cdot imag(S_{11}(f_n, Z_T)) + \frac{a}{20} \cdot 10^{\frac{b}{20}} \cdot \ln(10) \quad (15)$$

is minimized or substantially equal to zero.

Hence, according to aspects, the respective target reflection value of the section also comprises an average slope of a time domain representation of $S_{11ref}[f]$ corresponding to the section 101, 102, 103. The reflection value of the model of reflection then further comprises an average slope of a time domain representation of the model corresponding to the section.

A correct determination of the characteristic impedance of the second 102 and following sections is vital for accurate characterization of the complete transmission medium 100. Removing the reflected wave from a far end impedance due to mismatch, i.e., ohmic discontinuity, interconnection between sections, will obey the very same philosophy. In order to minimize one point in time domain it is necessary to calculate just one respective Fourier coefficient of the S-parameter vector.

Thus, according to some aspects, the estimating S5 further comprises estimating a characteristic impedance $Z_{02}$ of a second section 102 of the transmission medium 100, connected to the test equipment 110 via a first section 101 of the transmission medium having a pre-determined or estimated characteristic impedance $Z_{01}$, as $$Z_{02} = Z_{01} \cdot \frac{1 + S_{11}(T) \cdot e^{2\gamma_1 \cdot d_1}}{1 - S_{11}(T) \cdot e^{2\gamma_1 \cdot d_1}} \quad (16)$$

where $S_{11}(T)$ is a time domain representation of $S_{11ref}[f]$ evaluated at a time delay T corresponding to a distance $d_1$ from the test equipment 110 to the start of the second section 102, $d_1$ is the line length in meters of the first section 101, and $\gamma_1$ is a propagation constant of the first section 101 of the transmission medium 100.

The factor $e^{2\gamma_1 \cdot d_1}$ is due to the transformation of the reflection coefficient along the line distance $d_1$ from the test equipment 110 to the start of the second section 102 where the actual reflection occurred. In other words, $$S_{11}(T) = \frac{Z_{02} - Z_{01}}{Z_{02} + Z_{01}} \cdot e^{-2\gamma_1 \cdot d_1} \quad (17)$$

where $$\rho_{21} = \frac{Z_{02} - Z_{01}}{Z_{02} + Z_{01}} \quad (18)$$

is an expression from which the characteristic impedance $Z_{02}$ of the second section can be determined assuming that $Z_{01}$ has been determined or is otherwise known a-priori.

The product $\gamma_1 \cdot d_1$ can be estimated for example, from the time domain counterpart of the measured $S_{11ref}[f]$. Referring to equation (9), the real part of $\gamma_1 \cdot d_1$ can be estimated as $$\text{real}(\gamma_1 \cdot d_1) = \frac{1}{2} \cdot (\text{Magnitude}(T) - \text{Magnitude}(0)) \quad (19)$$

Similarly, the imaginary part of $\gamma_1 \cdot d_1$ can be determined by means of an unwrapped phase of the measured $S_{11ref}[f]$ as defined by equation (4).

The above expressions have an elegant interpretation which, according to some aspects, is used for calculation of a reflection coefficient at the transition between the first section 101 and the second section 102 at the time instance T, and also for determining the characteristic impedance $Z_{02}$ of the second section 102. Equation (16) corresponds to sliding a peak detected at the time instance T on the function described by equation (9) to the time instance T=0.

Consequently, adding the value of Magnitude(T)−Magnitude(0) to the value of the detected peak at the time instance T, one obtains a reflection coefficient, $\rho_{21}$, corresponding to the transition between the first section 101 and the second section 102, in logarithmic scale $$\rho_{21} = \frac{Z_{02} - Z_{01}}{Z_{02} + Z_{01}} = 10^{\frac{S_{11}(T) + (\text{Magnitude}(T) - \text{Magnitude}(0))}{20}} \quad (20)$$

from which the characteristic impedance $Z_{02}$ of the second section 102 of the transmission medium 100 can be determined.

Thus, according to some further aspects, the estimating S5 further comprises estimating a characteristic impedance of one or more further sections of the transmission medium 100 based on $Z_{ref}$ and $S_{11ref}[f]$.

In frequency domain, it is possible to determine the characteristic impedance of the second section, $Z_{02}$, in the following alternative way. An input impedance of a transmission line, which is not terminated with characteristic impedance at the far end, will be a function of the line length and parameters such as characteristic impedance and propagation constant. The impedance at the end of the first section is $$Z_1(f) = Z_{01} \cdot \frac{Z_2(f) + Z_{01} \cdot \tanh(\gamma_1 \cdot d_1)}{Z_{01} + Z_2(f) \cdot \tanh(\gamma_1 \cdot d_1)} \quad (21)$$

where $Z_2(f)$ is the input impedance of the second section, $d_1$ is the line length in meters of the first section, and $\gamma_1$ is a propagation constant of the first section. After some straightforward manipulation, the input impedance of the second section $Z_2(f)$ is expressed as $$Z_2(f) = Z_{01} \cdot \frac{Z_{01} - Z_1(f) \cdot \tanh(\gamma_1 \cdot d_1)}{Z_1(f) - Z_{01} \cdot \tanh(\gamma_1 \cdot d_1)} \quad (22)$$

Substituting equation (22) into equation (21) and again applying the definition of the reflection coefficient $\rho_{21}$, $$S_{11,2}[f, Z_{T2}] = \frac{Z_2[f] - Z_{T2}}{Z_2[f] + Z_{T2}} \quad (23)$$

which is in analogy with equation (3). Thus, the present method for estimating characteristic impedance of the first section described above can be applied again, and sequentially, to estimate the characteristic impedance of the second, or of a further, section of the transmission medium.

Expression (21) above can be also used to directly calculate the reflection coefficient, $\rho_{21}$, at the transition between the first 101 and the second 102 section of the transmission medium 100 at time instant T corresponding to the distance $d_1$. The reflection coefficient $\rho_{21}$ can be expressed as $$\rho_{21} = \frac{Z_1(f) - Z_{01}}{Z_1(f) + Z_{01}} \quad (24)$$

Substituting expression (21) into the above expression (24), after some manipulation, $$\rho_{21} = \frac{Z_2(f) - Z_{01}}{Z_2(f) + Z_{01}} \cdot e^{-2\gamma_1 \cdot d_1} \quad (25)$$

but at the time instance T, the signal transmitted on the transmission medium 100 has not propagated beyond the distance d1, and therefore $Z_2(f) = Z_{02}$ and $$\rho_{21} = \frac{Z_{02} - Z_{01}}{Z_{02} + Z_{01}} \cdot e^{-2\gamma_1 \cdot d_1} \quad (26)$$

which is identical to the above developments following equation (16).

Thus, there is an equivalence here between time and frequency domain which has been demonstrated by the above developments. This equivalence can be used to develop a number of methods similar to the method described herein, with similar purpose of estimating a characteristic impedance of a transmission medium.

In practice, the propagation constants, such as $\gamma_1$, are frequency dependent and therefore an amplification error, or measurement error, due to averaging is in principle unavoidable. However, by introducing an empirically established correction factor, k, the measured scattering parameters are, according to some aspects, corrected as $$S_{11,1}(f_n, Z_T) = k \cdot S_{11,1}(f_n, Z_T)_{measured} \quad (27)$$

where $S_{11,1}(f_n, Z_T)$ is the scattering parameter vector referred to in expressions above, and $S_{11,1}(f_n, Z_T)_{measured}$ corresponds to output data from the test equipment 110. According to one further aspect, the magnitude of the measured $S_{11}(T)$ is calibrated for a full reflection, i.e., specifically for $Z_T = 0$ and $Z_T = \infty$.

When said correction factor k is used, the expressions for the reflection coefficient are adapted accordingly. In example, the expression in equation (26) above is adapted as $$\rho_{21} = k \cdot \frac{Z_{02} - Z_{01}}{Z_{02} + Z_{01}} \cdot e^{-2\gamma_1 \cdot d_1} \quad (28)$$

In other aspects of the present disclosure, the scattering parameter vector $S_{11,1}(f_n, Z_T)$ is taken directly from the output of the test equipment 110, i.e., it is not calibrated.

In addition to the methods disclosed herein, there is further disclosed a computer program comprising computer program code which, when executed in a line estimation device causes the line estimation device to execute a method according to any of the aspects disclosed herein.

Turning again to FIG. 1, the above described method for estimating characteristic impedance or impedances is implemented by the line estimation device 300 shown in FIG. 1.

Thus, the line estimation device 300 is arranged to estimate a characteristic impedance $Z_{01}$, $Z_{02}$, $Z_{03}$ of a section 101, 102, 103 of a transmission medium 100 in a communication system. The line estimation device comprises a test equipment 110, having a test port 111 with known impedance $Z_{ref}$, and is arranged to determine an $S_{11}$ scattering parameter vector $S_{11ref}[f]$ of the transmission medium 100, indexed by frequency f. The vector $S_{11ref}[f]$ describes signal reflection in the transmission medium 100.

The line estimation device 300 also comprises a model of reflection 120 in the transmission medium 100 corresponding to an observation of the transmission medium 100 via a test port 121 having a test impedance $Z_T$, as well as a processing unit 310 arranged to estimate the characteristic impedance $Z_{01}$, $Z_{02}$, $Z_{03}$ of the section 101, 102, 103, based on $Z_{ref}$ and $S_{11ref}[f]$, as a value of $Z_T$ which minimizes a difference between a reflection value of the model of reflection 120 and a respective target reflection value of the section.

According to some aspects, the model of reflection 120 comprises an $S_{11}$ scattering parameter vector $S_{11T}[f]$ having a time domain representation $S_{11T}(T)$ determined by a single point of the inverse fast Fourier transform, IFFT, evaluated in time delay T corresponding to a distance from the test equipment 110 to the start of the section.

According to some other aspects, the processing unit 310 is arranged to estimate a characteristic impedance $Z_{01}$ of a first section 101 of the transmission medium directly connected to the test equipment 110. The model of reflection 120 then comprises a first $S_{11}$ scattering parameter vector $S_{11,1}[f]$ given by equation (3)

According to some further aspects, the processing unit 310 is arranged to estimate a characteristic impedance $Z_{02}$ of a second section 102 of the transmission medium 100, connected to the test equipment 110 via a first section 101 of the transmission medium having a pre-determined or estimated characteristic impedance $Z_{01}$ given by equation (16), where $S_{11}(T)$ is a time domain representation of $S_{11ref}[f]$ evaluated at a time delay T corresponding to a distance $d_1$ from the test equipment (110) to the start of the second section and $\gamma_1$ is a pre-determined propagation constant of the first section 101 of the transmission medium 100.

According to aspects, the processing unit 310 is arranged to estimate a characteristic impedance of one or more further sections of the transmission medium 100 based on $Z_{ref}$ and $S_{11ref}[f]$.

The invention claimed is:

1. A method in a line estimation device for estimating a characteristic impedance of a transmission medium in a communication system, the method comprising:
   determining, by a test equipment having a first test port with known impedance $Z_{ref}$, an $S_{11}$ scattering parameter vector $S_{11ref}[f]$ of the transmission medium, indexed by a frequency f, the vector $S_{11ref}[f]$ describing a signal reflection in the transmission medium;
   generating, based on $Z_{ref}$ and $S_{11ref}[f]$, a model of reflection in the transmission medium describing signal reflection values in the transmission medium for a second test port having a variable test impedance $Z_T$ that is different than $Z_{ref}$; and
   estimating a characteristic impedance of a section of the transmission medium as a value of $Z_T$ which minimizes a difference between a signal reflection value of the model of reflection and a respective target reflection value of the section.

2. The method according to claim 1, wherein the respective target reflection value of the section comprises a constant value set to zero.

3. The method according to claim 1, wherein the respective target reflection value of the section comprises a straight line fitting to a time domain representation of $S11_{ref}[f]$, evaluated at a time delay T corresponding to a distance from the test equipment to a start of the section.

4. The method according to claim 1, wherein the respective target reflection value of the section further comprises an average slope of a time domain representation of $S_{11ref}[f]$ corresponding to the section, and wherein a reflection value of the model of reflection further comprises an average slope of a time domain representation of the model corresponding to the section.

5. The method according to claim 1, wherein the model of reflection comprises an $S_{11}$ scattering parameter vector $S_{11T}[f]$ having a time domain representation $S_{11T}(T)$ determined by a single point of an inverse fast Fourier transform, IFFT, evaluated in time delay T corresponding to a distance from the test equipment to a start of the section.

6. The method according to claim 5, wherein the section is a first section of the transmission medium directly connected to the test equipment, T=0, and said time domain representation is given by $$S_{11T}(T) = \sum_{n=0}^{N-1} S_{11T}[f]$$

where N equals the length of vector S11T[f].

7. The method according to claim 5, wherein the section is a first section of the transmission medium directly connected to the test equipment, T=0, and said time domain representation is given by $$S_{11T}(T) = \text{real}\left\{\sum_{n=0}^{N-1} S_{11T}[f]\right\}$$

where N equals the length of vector S11T[f].

8. The method according to claim 1, wherein the estimating comprises estimating a characteristic impedance $Z_{01}$ of a first section of the transmission medium directly connected to the test equipment, the model of reflection comprising a first $S_{11}$ scattering parameter vector $S_{11,1}[f]$ given by $$S_{11,1}[f] = \frac{\frac{1+S_{11ref}[f]}{1-S_{11ref}[f]}Z_{ref} - Z_T}{\frac{1+S_{11ref}[f]}{1-S_{11ref}[f]}Z_{ref} + Z_T}.$$

9. The method according to claim 1, wherein the estimating further comprises estimating a characteristic impedance $Z_{02}$ of a second section of the transmission medium, connected to the test equipment via a first section of the transmission medium having a pre-determined or estimated characteristic impedance $Z_{01}$, as $$Z_{02} = Z_{01} \cdot \frac{1+S_{11}(T) \cdot e^{2\gamma_1 \cdot d_1}}{1-S_{11}(T) \cdot e^{2\gamma_1 \cdot d_1}},$$

where $S_{11}(T)$ is a time domain representation of $S_{11ref}[f]$ evaluated at a time delay T corresponding to a distance $d_1$ from the test equipment to a start of the second section and $\gamma_1$ is a pre-determined propagation constant of the first section of the transmission medium.

10. The method according to claim 1, wherein the estimating further comprises estimating a characteristic impedance of one or more further sections of the transmission medium based on $Z_{ref}$ and $S_{11ref}[f]$.

11. The method according to claim 1, wherein the determining further comprises:
   transmitting, by the test equipment, a test signal on the transmission medium via the first test port with known impedance $Z_{ref}$; and
   receiving a reflected signal of the test signal; and wherein the $S_{11}$ scattering parameter vector $S_{11ref}[f]$ is determined based on the reflected signal.

12. A line estimation device arranged to estimate a characteristic impedance of a section of a transmission medium in a communication system, the line estimation device comprising:
   a test equipment, having a first test port with known impedance $Z_{ref}$, arranged to determine an $S_{11}$ scattering parameter vector $S_{11ref}[f]$ of the transmission medium, indexed by a frequency f, the vector $S_{11ref}[f]$ describing a signal reflection in the transmission medium;
   a model of reflection in the transmission medium describing signal reflection values in the transmission medium for a second test port having a variable test impedance $Z_T$ that is different than $Z_{ref}$; and
   a processor unit arranged to estimate the characteristic impedance of the section, based on $Z_{ref}$ and $S_{11ref}[f]$, as a value of $Z_T$ which minimizes a difference between a reflection value of the model of reflection and a respective target reflection value of the section.

13. The line estimation device according to claim 12, wherein the respective target reflection value of the section comprises a constant value set to zero.

14. The line estimation device according to claim 12, wherein the respective target reflection value of the section comprises a straight line fitting to a time domain representation of $S11_{ref}[f]$, evaluated at a time delay T corresponding to a distance from the test equipment to a start of the section.

15. The line estimation device according to claim 12, wherein the model of reflection comprises an $S_{11}$ scattering parameter vector $S_{11,T}[f]$ having a time domain representation $S_{11,T}(T)$ determined by a single point of an inverse fast Fourier transform, IFFT, evaluated in time delay T corresponding to a distance from the test equipment to a start of the section.

16. The line estimation device according to claim 12, wherein the processing unit is arranged to estimate a characteristic impedance $Z_{01}$ of a first section of the transmission medium directly connected to the test equipment, and wherein the model of reflection comprises a first $S_{11}$ scattering parameter vector $S_{11,1}[f]$ given by $$S_{11,1}[f] = \frac{\frac{1+S_{11ref}[f]}{1-S_{11ref}[f]}Z_{ref} - Z_T}{\frac{1+S_{11ref}[f]}{1-S_{11ref}[f]}Z_{ref} + Z_T}.$$

17. The line estimation device according to claim 12, wherein the processing unit is arranged to estimate a characteristic impedance $Z_{02}$ of a second section of the transmission medium, connected to the test equipment via a first section of the transmission medium having a pre-determined or estimated characteristic impedance $Z_{01}$, as $$Z_{02} = Z_{01} \cdot \frac{1+S_{11}(T) \cdot e^{2\gamma_1 \cdot d_1}}{1-S_{11}(T) \cdot e^{2\gamma_1 \cdot d_1}},$$

where $S_{11}(T)$ is a time domain representation of $S_{11ref}[f]$ evaluated at a time delay T corresponding to a distance $d_1$ from the test equipment to a start of the second section and $\gamma_1$ is a pre-determined propagation constant of the first section of the transmission medium.

18. The line estimation device according to claim 12, wherein the processing unit is arranged to estimate a characteristic impedance of one or more further sections of the transmission medium based on $Z_{ref}$ and $S_{11ref}[f]$.

* * * * *